(12) United States Patent
Burrow et al.

(10) Patent No.: US 9,899,816 B2
(45) Date of Patent: Feb. 20, 2018

(54) PRESSURE COMPENSATOR AND ELECTRICAL CONNECTION DEVICE

(71) Applicant: Siemens Aktiengesellschaft, Munich (DE)

(72) Inventors: Christopher Burrow, Ulverston (GB); Richard Lewin, Ulverston (GB); Christopher Plant, Lancaster (GB); Antonella Simpson, Barrow-In-Furness (GB); Daniel Walton, Morecambe (GB)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/311,908

(22) PCT Filed: May 8, 2015

(86) PCT No.: PCT/EP2015/060204
§ 371 (c)(1),
(2) Date: Nov. 17, 2016

(87) PCT Pub. No.: WO2015/185325
PCT Pub. Date: Dec. 10, 2015

(65) Prior Publication Data
US 2017/0085071 A1 Mar. 23, 2017

(30) Foreign Application Priority Data

Jun. 4, 2014 (EP) .................................... 14171161
Nov. 18, 2014 (EP) .................................... 14193743

(51) Int. Cl.
*H02G 3/08* (2006.01)
*H05K 5/06* (2006.01)
(Continued)

(52) U.S. Cl.
CPC ............... *H02G 3/088* (2013.01); *H02G 3/02* (2013.01); *H02G 3/16* (2013.01); *H02G 3/22* (2013.01); *H05K 5/067* (2013.01); *H05K 5/068* (2013.01)

(58) Field of Classification Search
CPC ............ H02G 3/088; H02G 3/02; H02G 3/16; H02G 3/22; H05K 5/067; H05K 5/068; H05K 5/06; H01R 13/523; E21B 33/035
(Continued)

(56) References Cited

U.S. PATENT DOCUMENTS 3,508,188 A * 4/1970 Buck .................... H01R 13/523
439/199
3,963,297 A 6/1976 Panek et al.
(Continued)

FOREIGN PATENT DOCUMENTS

EP 2169690 A1 3/2010
EP 2501608 A1 9/2012
(Continued)

OTHER PUBLICATIONS

EP Search Report dated Jun. 9, 2015, for EP application No. 14193743.3.
(Continued)

*Primary Examiner* — Angel R Estrada
(74) *Attorney, Agent, or Firm* — Beusse Wolter Sanks & Maire (57) ABSTRACT

A pressure compensator for compensating volume variations of a medium. The pressure compensator has a first compensator part and a second compensator part. The first compensator part encloses a first volume and the second compensator part encloses a second volume. The first and second volumes are in flow communication. The first compensator (Continued)

part includes a first bellows portion and the second compensator part includes a second bellows portion. A moveable element, to which the first bellows portion and the second bellows portion are mechanically coupled such that movement of the moveably element along a predetermined axis results in the compression of one of the bellows portions and in the expansion of the other of the bellows portions.

16 Claims, 9 Drawing Sheets

(51) Int. Cl.
  *H02G 3/02* (2006.01)
  *H02G 3/16* (2006.01)
  *H02G 3/22* (2006.01)
(58) Field of Classification Search
  USPC ........ 174/14 BH, 17 R, 50, 68.1, 68.3, 70 C,
   174/88 R; 248/68.1, 49; 285/149.1,
   285/154.1
  See application file for complete search history.

(56) References Cited

U.S. PATENT DOCUMENTS

| | | | |
|---|---|---|---|
| 5,738,535 A | 4/1998 | Cairns | |
| 7,018,226 B2 * | 3/2006 | Milner | H01R 13/5213 439/321 |
| 7,063,549 B1 * | 6/2006 | Chen | H01R 13/622 439/277 |
| 8,701,520 B2 * | 4/2014 | Chiou | H02G 3/0641 174/480 |
| 2009/0042437 A1 | 2/2009 | Maeland et al. | |

FOREIGN PATENT DOCUMENTS

| | | |
|---|---|---|
| EP | 2610881 B1 | 4/2014 |
| GB | 1379525 A | 1/1975 |
| WO | 2011088840 A | 7/2011 |
| WO | 2011088840 A1 | 7/2011 |

OTHER PUBLICATIONS

International Search Report dated Jun. 9, 2015, for PCT application No. PCT/EP2015/060204.
EP Search Report dated Aug. 1, 2014, for EP application No. 14171161.4.

* cited by examiner

PRESSURE COMPENSATOR AND ELECTRICAL CONNECTION DEVICE

CROSS REFERENCE TO RELATED APPLICATIONS

This application is the US National Stage of International Application No. PCT/EP2015/060204 filed May 8, 2015, and claims the benefit thereof. The International Application claims the benefit of European Application No. EP14171161 filed 4 Jun. 2014, and European Application No. EP14193743 filed 18 Nov. 2014. All of the applications are incorporated by reference herein in their entirety.

FIELD OF THE INVENTION

The invention relates to a pressure compensator for compensating volume variations of a medium and to a method of manufacturing a pressure compensator. The invention further relates to an electrical contacting device, in particular a connector or termination assembly, comprising such pressure compensator.

BACKGROUND

Due to the increasing energy demand, offshore oil and gas production is moving into deeper waters. For ensuring an efficient and secure production of hydrocarbons from a subsea well, processing facilities are being installed at the ocean floor. Such subsea installations can comprise a range of components, including pumps, compressors and the like as well as a power grid for providing such components with electric power. The power grid may for example comprise a subsea transformer, subsea switchgear and subsea variable speed drives (VSDs). Such components of a subsea installation may be installed at water depths of 3,000 m or more, so that they are exposed to pressures up to or even in excess of 300 bars. To protect such components from the corrosive seawater and to handle the high pressures prevailing in such subsea environment, these components are provided with subsea enclosures.

For providing relatively compact and lightweight enclosures, pressure compensated enclosures (also termed pressurized enclosures) may be used, which comprise a volume/pressure compensator which balances the pressure in the enclosure to the pressure prevailing in the ambient seawater. The pressure compensated enclosure is generally filled with a liquid, and components operated inside the pressure compensated enclosure are made to be operable under high pressures. The pressure/volume compensator compensates variations in the volume of the liquid filling the enclosure, which may occur due to variations in ambient pressure and/or in temperature. Temperature changes can be caused by deployment at the subsea location and by internal heating, e.g. due to electric losses.

Pressure compensators may include metal bellows, rubber bellows, pistons or the like. As an example, the document EP 2501608 A1 discloses a pressure compensation system which achieves a double barrier against the ingress of seawater.

Furthermore, the document EP 2610881 B1 discloses a configuration which makes use of a particular arrangement of two bellows, thus increasing the compensation volume and keeping the dead volume small. A single barrier configuration having an improved reliability can thus be achieved.

Such configurations generally have moving parts of considerable size. Due to their size and shape, they are generally not suitable for integration into compact electric devices, such as electrical connectors, termination assemblies and the like. Accordingly, if such devices comprise an oil filled volume which requires pressure compensation, a wall enclosing such volume is generally made of a resilient material, so as to provide the required flexibility for volume compensation and pressure balancing. Yet such materials, for example elastomers or the like, generally suffer from the problem that after a certain period of time, seawater may permeate through the barrier made of such material. Accordingly, the dielectric medium behind the barrier may become polluted by the ingress of seawater over time. It is thus desirable to provide pressure compensation for such electrical connection devices in a compact way without the risk of ingress of seawater.

SUMMARY OF INVENTION

Accordingly there is a need for improving pressure compensation for subsea devices, and in particular for a compact pressure compensator which does not suffer from seawater diffusion or permeation.

This need is met by the features of the independent claims. The dependent claims describe embodiments of the invention.

According to an embodiment of the invention, a pressure compensator for compensating volume variations of a medium is provided. The pressure compensator comprises a first compensator part enclosing a first volume and a second compensator part enclosing a second volume. The first volume and the second volume are in flow communication. The first compensator part includes a first bellows portion and the second compensator part includes a second bellows portion. The pressure compensator further comprises a moveable element to which the first bellows portion and the second bellows portion are mechanically coupled such that movement of the moveable element in a predetermined direction (or along a predetermined axis) results in the compression of one of the bellows portions and in the expansion of the other of the bellows portions. The first and the second compensator parts are configured such that a movement of the moveable element in the predetermined direction (or along the predetermined axis) results in a volume change of the first volume and in a volume change of the second volume. The volume change of the second volume is different to the volume change of the first volume.

In such configuration, a relatively compact pressure compensator can be achieved, since bellows compression/expansion occurs via the moveable element to which both bellows portions are coupled, thus allowing the use of fixed end walls. The first and second volumes may be separated by the moveable element, and the flow communication may occur through or past/around the moveable element. Accordingly, sealing of such pressure compensator is facilitated, since it is not required to seal the first volume located on one side of the moveable element towards the second volume located on the other side of the moveable element. Sealing to a moveable element, which is generally rather difficult, may thus be avoided.

The first volume and/or the second volume may for example be in flow communication with a volume that is to be pressure compensated, such as an internal volume of a connector, a termination assembly, or the like. The flow communication may occur via a respective a flow passage.

In an embodiment, the first bellows portion has an outer perimeter, in particular a circumference, that is larger than an outer perimeter (or circumference) of the second bellows portion. The volume change of the first volume may be larger than the volume change of the second volume when moving the moveable element. By such differently sized bellows portions, the volume that is displaced upon moving of the moveable element may thus be made different for the first compensator part and the second compensator part. In other embodiments, the first and second bellows portions may have similar circumferences, and the different displacement upon movement of the moveable element may be achieved in a different way, for example by making use of a respective structure, such as a bellows or telescopic structure, arranged in one of the volumes.

In an embodiment, the first compensator part has a first end wall and the second compensator part has a second end wall. The first and the second end walls may have a fixed distance. The moveable element may be moveable with respect to the first and second end walls, in particular between the first and second end walls. The first and second end walls may be considered to form stationary end walls, since they might be stationary with respect to a device for which the pressure compensator is to be employed, in particular to which it is mounted.

The moveable element may have an annular shape. An opening in the moveable element may provide the flow communication between the first and second volumes. Such opening may be the central opening provided by the annulus, or dedicated openings may be provided in the annular shape, for example at an outer portion of the annulus.

The moveable element may for example have a central opening and it may be configured to allow the arrangement of a cylindrical structure through the central opening. The flow communication between the first and second volumes may then occur through an opening formed between the cylindrical structure and the moveable element. This may be an annular opening or it may be provided by annular segments, for example in cases where the moveable element is in (physical) contact with the cylindrical structure. Such configuration may allow the use of the pressure compensator in a compact electric device, since parts of the device may reach through the pressure compensator.

The first and the second compensator parts may have a cylindrical shape, and the first compensator part and second compensator part may be arranged coaxially on an axis that is parallel to the predetermined direction.

The pressure compensator may further comprise a guiding structure, and the moveable element may have a bearing surface that bears against the guiding structure to guide the moveable element parallel to the predetermined axis during movement thereof. Such configuration may prevent damage to the bellows parts of the pressure compensator by avoiding out-of-range movements. Furthermore, the mass of the moveable element may by supported by the guiding structure. Also, by such guiding structure, cross-locking of the moveable element during compensation movements may be prevented. In particular, the ratio of the diameter of the moveable element to the width of the bearing surface may be chosen low enough so as to prevent such cross-locking.

In an embodiment, the moveable element may comprise a bearing ring that provides the bearing surface. The bearing ring may be shaped so as to at least partially overlap the first or second bellows portion.

The moveable element may include a coupling flange. It may further include such bearing ring which is attached, for example bolted or welded, to the coupling flange. Assembly of the moveable element may thus be facilitated.

Furthermore, by providing the overlap, it may be achieved that the width of the bearing surface does not add to the overall length of the pressure compensator, thereby providing a compact design. The bearing surface may be made wider without affecting the packaging of the bellows in the compensator, while retaining a low diameter to width ratio to prevent cross-locking. Furthermore, by configuring the bearing surface with a respective overlap over the bellows portion, the bearing surface may act as a travel stop to prevent over-compression of the bellows portion. If the first and second bellows portions have different circumferences, the bearing ring advantageously overlaps the smaller bellows portion.

The guiding structure may comprise a compensator housing. The first compensator part and the second compensator part may be arranged in the compensator housing. The bearing surface may comprise an outer peripheral surface of the moveable element that bears against an inner surface of the compensator housing. A precise and effective guidance of the moveable element may thus be achieved, while retaining a compact design.

Additionally or alternatively, the guiding structure may comprise a (cylindrical) structure arranged inside the first and/or second compensator part. The bearing surface may comprise an inner surface, in particular an inner diameter surface, of the moveable element, that bears against an outer surface of the guiding structure. It should be clear that the inner surface, in particular the inner diameter surface, does not necessarily need to be continuous, but may for example have recesses or notches, for example for allowing the flow communication between the first and second volumes.

Furthermore, the guiding structure may comprise or consist of a compliant material, in particular an elastomeric material, against which the respective bearing surface bears. As an example, the guiding structure may be provided with a rigid supporting structure and a layer of the compliant material. By the compliant material, displacement of the moveable element due to vibrations or the like may be damped, and hard collisions between the guiding structure and the bearing surface may be prevented.

In a particular example, the bearing surface or the complementary surface of the guiding structure may have ridges that are oriented substantially parallel to the direction of movement of the moveable element, i.e. to the predetermined direction. The ridges may abut against the respective other surface. The ridges may be made of the compliant material, and they may be shaped so as to progressively increase the spring rate under compression. An effective dampening of transverse movements of the moveable element may thus be achieved.

In an embodiment, the first compensator part has a first annular end wall and the second compensator part has a second annular end wall. The movable element has an annular shape and is arranged between the first and second annular end walls and movable relatively thereto. The first and second annular end walls and the movable element are arranged coaxially to one another. The first and second end walls and the movable element may be configured to be arranged on a cylindrical structure or to allow the passage of a cylindrical structure there through. The predetermined direction or axis (along which the movable element moves) may for example be parallel or correspond to the central axis of the cylindrical structure. In such configuration, a compact design can be achieved since a part of a subsea electrical connection device, such as of an electrical connector, can pass through the pressure compensator. Due to the configuration of the pressure compensator, it is not necessary to seal the moveable element to the cylindrical structure. Rather, the flow of fluid through or past the movable element, e.g. between the moveable element and the cylindrical structure, may be permissible to provide the above mentioned flow communication. Since the annular end walls may be stationary, they may be sealed in a relatively simple way to the cylindrical structure. In other configurations, one end wall or both end walls may not need to be sealed to the cylindrical structure, for example for allowing fluid communication through a space between the cylindrical structure and the respective end wall. Such fluid communication may occur towards a volume or chamber of the respective device for which the pressure compensator provides volume compensation and pressure balancing.

In particular, the first end wall and/or the second end wall may be mountable to the cylindrical structure or to the device in a position that is fixed relatively to the cylindrical structure or the device, in particular to a cylindrical structure in form of an insulated conductor passing through the first and second end walls and the moveable element.

In an embodiment, the first and second bellows portions are cylindrical bellows portions each being mounted at one end to the moveable element and at the other end to an end wall of the respective first or second compensator parts. The first bellows portion has a larger diameter than the second bellows portion, and the first and second bellows portion and the moveable element are arranged coaxially between the end walls.

As an example, the bellows portions may be provided with a flange at each end and may be bolted to the respective end wall and to the moveable element. In other embodiments, they may be welded or soldered to the end wall/moveable element.

The bellows portions may in particular be metal bellows portions. Accordingly, the diffusion or permeation of an unwanted medium, such as seawater, through such bellows portion may be prevented.

In a particular configuration, each bellows portion may be made of concertina bellows elements comprising a plurality of metal disks welded together at their respective edges. A compact and reliable configuration of the bellows portions may thus be achieved, while providing an improved barrier against seawater ingress.

The first volume and the second volume may be filled with dielectric medium, in particular a dielectric liquid or a gel. A viscous medium, such as oil or gel, may provide support and may furthermore dampen high accelerations, thereby preventing damage to the pressure compensator due to vibrations or the like. Furthermore, such dielectric liquid or gel is generally compatible with the electric components that may be present in a chamber for which the pressure compensator provides volume and pressure compensation, e.g. to an insulated or exposed conductor.

The first and second volumes may form part of a secondary volume (i.e. are in flow communication therewith), and the first and second bellows portions may provide a separation towards a primary volume. The primary volume may also be filled with a dielectric liquid or gel. As an example, a space between a compensator housing and the first and second bellows portions may be filled with such dielectric liquid or gel.

The pressure compensator may be configured to provide pressure balancing between a chamber of a subsea device and a high pressure environment. In particular, the pressure compensator may be configured to be operable up to a pressure of at least 200 bar, advantageously at least 300 bar, more advantageously at least 450 bar. It may be configured to be operable at a water depth of at least 2000 m, advantageously at least 3000 m.

According to a further embodiment of the invention, an electrical connection device for use underwater or in a wet or severe environment is provided. The electrical connection device comprises a housing, a chamber in the housing filled with a dielectric medium, and a cylindrical structure, in particular an insulated conductor or pin, or a cylindrical passage arranged in the housing. The electrical connection device furthermore comprises a pressure compensator that is configured in accordance with any of the above outlined embodiments and configurations. The pressure compensator is arranged in the housing around the cylindrical structure or cylindrical passage. The first and second volumes of the pressure compensator are in flow communication with the chamber to provide pressure compensation for the chamber. With such design of the pressure compensator, it becomes possible to arrange the compensator around the cylindrical structure or passage, so that a very compact electrical connection device can be achieved. Furthermore, due to the use of bellows portions in place of a membrane, the protection against the ingress of seawater into the first and second volumes and thus into the chamber may be improved.

In an embodiment, the electrical contacting device is a connector part of a connector, in particular a plug part, a cable termination assembly, a cable gland, or an interface unit for a connector, for example a coupling part coupled between the connector part and the cable termination assembly. The electrical connection device may in particular be a plug part of a subsea connector having a plug body formed by said housing, with a shuttle pin being disposed in the plug body. The chamber that is pressure compensated by means of the pressure compensator may be located in the plug body rearwards of the shuttle pin (in the unmated state of the plug part).

In an embodiment, the pressure compensator is arranged in the housing to provide pressure compensation for a secondary volume, the pressure compensator further providing a liquid-tight barrier between the secondary volume and a primary volume. The electrical connection device may further comprise at least one further pressure compensator configured to provide pressure balancing between the primary volume and an ambient medium surrounding the electrical contacting device when installed subsea. The further pressure compensator may for example be a membrane or diaphragm pressure compensator, yet in other embodiments, it may be a pressure compensator that is configured in accordance with any of the above described embodiments. A double barrier against the ingress of seawater may thus be achieved, while retaining a compact configuration.

According to a further embodiment of the invention, a pressure compensation assembly is provided which comprises a first pressure compensator that is configured according to any of the above outlined embodiments. The pressure compensation assembly further includes a second pressure compensator that is configured in accordance with any of the above embodiments. The pressure compensation assembly has a first chamber, the first pressure compensator being in flow communication with the first chamber to provide pressure compensation. The first pressure compensator is arranged in a second chamber and the second pressure compensator is in flow communication with the second chamber to provide pressure compensation thereof. Such configuration may achieve a double barrier against the ingress of ambient medium.

The first pressure compensator and the second pressure compensator may be arranged coaxially on an axis that is parallel to the predetermined direction. In some embodiments, they may be arranged such that the bellows portions of the first pressure compensator overlap the bellows portions of the second pressure compensator. They may for example be arranged such that the first pressure compensator is arranged within the second pressure compensator. Although such solution is relatively compact in the longitudinal direction along the predetermined axis, it requires more space in transverse direction.

In other embodiments, the first and second pressure compensators may be arranged on an axis that is parallel to the predetermined direction such that the bellows portions of the first pressure compensator do not overlap with the bellows portions of the second pressure compensator (i.e. no overlap in radial direction). In such configuration, the transverse size of the pressure compensation assembly can be kept relatively small.

The electrical connection device and the pressure compensation assembly may each be configured to be operable in a high pressure environment, in particular at a water depth of at least 2000 m, advantageously at least 3000 m.

According to a further embodiment of the invention a method of manufacturing a pressure compensator is provided. The method comprises the steps of providing a first compensator part including a first bellows portion, the first compensator part enclosing a first volume; providing a second compensator part including a second bellows portion, the second compensator part enclosing a second volume; and providing a moveable element, wherein the first volume and the second volume are in flow communication through or around the moveable element. The method includes the further step of mechanically coupling the first bellows portion and the second bellows portion to the moveable element such that movement of the moveable element in a predetermined direction (or along a predetermined axis) results in the compression of one of the bellows portions and in the expansion of the other of the bellows portions. The first and the second compensator parts are configured such that a movement of the moveable element in the predetermined direction (or along the predetermined axis) results in a volume change of the first volume and in a volume change of the second volume that is different from the volume change of the first volume.

By such method, a pressure compensator that has advantages similar to the ones outlines further above may be achieved. The method may be performed so as to obtain a pressure compensator in any of the above outlined embodiments or configurations.

It is to be understood that the features mentioned above and those yet to be explained below can be used not only in the respective combinations indicated, but also in other combinations or in isolation, without leaving the scope of the present invention.

BRIEF DESCRIPTION OF THE DRAWINGS

The foregoing and other features and advantages of the invention will become further apparent from the following detailed description read in conjunction with the accompanying drawings. In the drawings, like reference numerals refer to like elements.

DETAILED DESCRIPTION

In the following, the embodiments illustrated in the accompanying drawings are described in more detail. It should be clear that the following description is only illustrative and non-restrictive. The drawings are only schematic representations, and elements in the drawings are not necessarily to scale with each other.

Figure 1:
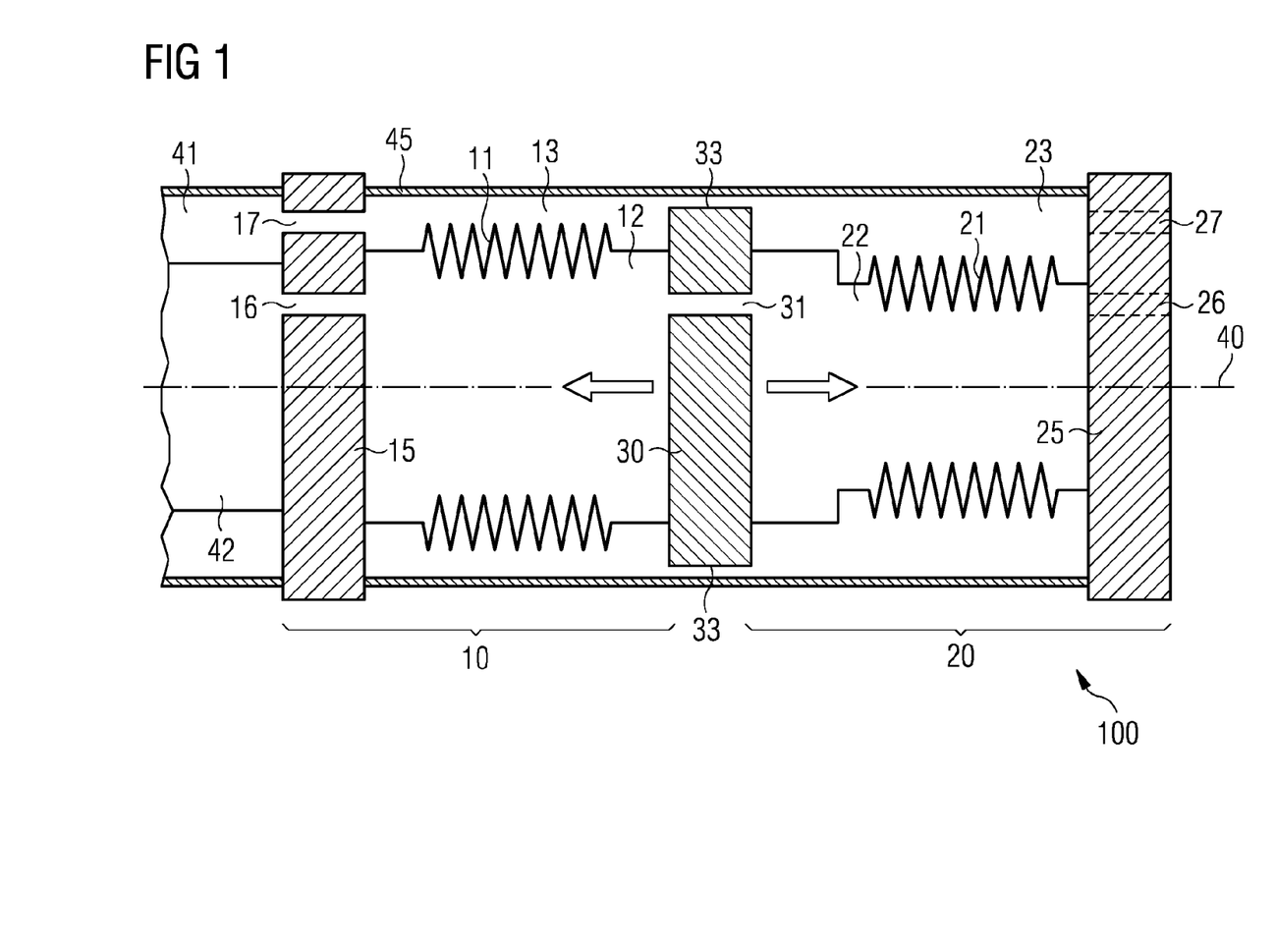
FIG. 1 is a schematic drawing showing a pressure compensator according to an embodiment of the invention.

FIG. 1 shows a pressure compensator 100 according to an embodiment of the invention including the first compensator part 10 and the second compensator part 20. The first compensator part 10 comprises the first bellows portion 11 that is mechanically coupled to the moveable element 30, and the second compensator part 20 comprises the second bellows portion 21 that is mechanically coupled to the moveable element 30. The first compensator part 10 further includes the end wall 15 and encloses the first volume 12. The second compensator part 20 further includes the end wall 25 and encloses the second volume 22. In the moveable element 30, a flow passage 31 is provided via which the first and second volumes 12, 22 are in flow communication. The moveable element 30 provides separation between the first and second volumes 12, 22.

The end walls 15, 25 are stationary with respect to the device for which the pressure compensator 100 is to be used. In the present example, housing 45 is provided to which the end walls 15, 25 are mounted. Housing 45 may be a dedicated compensator housing and thus form part of the pressure compensator 100, or it may form part of the device to which the pressure compensator 100 is mounted, for example a housing of an electrical connector or termination assembly.

The moveable element 30 is moveable (back and forth) between the end walls 15, 25 in a predetermined direction that is parallel to the axis 40, which is a longitudinal axis along which the pressure compensator 100 extends. The possible movement is indicated by arrows in FIG. 1. End walls 15, 25 and moveable element 30 may have a disk shape or annular shape, and may be aligned coaxially, with axis 40 being the central axis.

The pressure compensator 100 is configured such that when the moveable element 30 moves along the axis 40 in the direction of one of the arrows, the volume change of volume 12 is different to the volume change of volume 22. Accordingly, the total volume available in (or enclosed by) the first and second compensator parts 10, 20 changes. In the example of FIG. 1, if moveable element 30 is moved in the direction to the right, volume 12 is increased by a larger amount than that by which the volume 22 is reduced, so that in total, a volume increase occurs. On the other hand, if moveable element 30 is moved towards left direction, volume 12 is decreased by an amount larger than the increase in volume 22, so that the total volume is decreased. Accordingly, the pressure compensator 100 can adjust the total volume of medium filling the first and second volumes 12, 22 by allowing movement of moveable element 30 in the respective direction.

In the example FIG. 1, this is achieved by providing the first bellows portion 11 with a larger perimeter in circumferential direction than the second bellows portion 21. In particular, it has a larger outer circumference and a larger diameter than the second bellows portion 21.

Other configurations for achieving the different volume changes are conceivable. As an example, in some embodiments, the first and second bellows portions 11, 21 may have the same circumference, and the differences in volume displacement upon movement of moveable element 30 may be achieved by providing an element, such as a further bellows element, a telescopic element or the like, in one of the volumes to change the amount of displaced medium.

In FIG. 1, pressure compensator 100 provides pressure compensation for a medium filling the chamber 42, which may be a "secondary volume". The medium may for example be a dielectric liquid or gel. If the medium filling chamber 42 expands or contracts, for example due to temperature changes, the respective medium may enter or leave the first volume 12 through the flow passage 16 provided in end wall 15 (additionally or alternatively, a corresponding flow passage 26 may be provided in end wall 25). Also, the medium filling the volumes 12, 22 may itself change its volume, e.g. due to the above temperature changes, and may thus require volume compensation.

When the medium in chamber 42 and/or the volumes 12, 22 expands, the pressure will increase which will in turn push the moveable element 30 towards the right. The combined volume 12, 22 is thus increased, thus accommodating the expansion of the medium and equalizing the pressure. Movement of the moveable element 30 thus compensates for the volume change and balances the pressure inside the volumes 12, 22 to the pressure prevailing outside thereof. Similarly, if the medium contracts due to temperature changes, the volume will be reduced by movement of the moveable element 30 towards the left. Note that not only volume changes due to pressure and temperature changes may be accommodated, but also volume changes that are caused by the displacement of a component, such as a pin of a connector entering chamber 42 or the like.

The volumes 13, 23 between the bellows portions 11, 21 and the housing 45 may similarly be filled with a medium, such as dielectric liquid or gel, or they may be filled with an ambient medium, such as seawater when installed subsea. The medium filling these volumes may flow past or around the moveable element 30 upon movement thereof, or moveable element 30 may comprise dedicated flow passages for allowing the flow of such medium. Furthermore, the combined volume 13, 23 similarly changes upon movement of movable element 30, of the volume of the medium therein may change due to temperature variations, which can be accommodated by allowing the medium to flow out of or into these volumes 13, 23 through a flow passage 17 in end wall 15 and/or a flow passage 27 in end wall 25. The medium may be in flow communication with a further pressure compensator for accommodating these volume changes, or a flow passage towards the surrounding environment may be provided, so that seawater may for example flow into and out of these volumes. The medium may for example flow into the chamber 41 or 'primary volume' which can again be pressure compensated against an ambient medium, such as seawater in a subsea environment.

It should be clear that the configuration may also be reversed, so that the volumes 13 and 23 constitute for example the second and the first volume, respectively, with chamber 41 forming the secondary volume for which pressure compensator 100 provides pressure compensation. These volumes are then enclosed by the outer wall 45, the end walls 15, 25, the first and second bellows portions 11, 21 and the moveable element 30. In even other configurations, no such housing 45 may be provided and the pressure compensator 100 may simply be disposed inside a chamber or may be directly disposed in the subsea environment.

Figure 2:
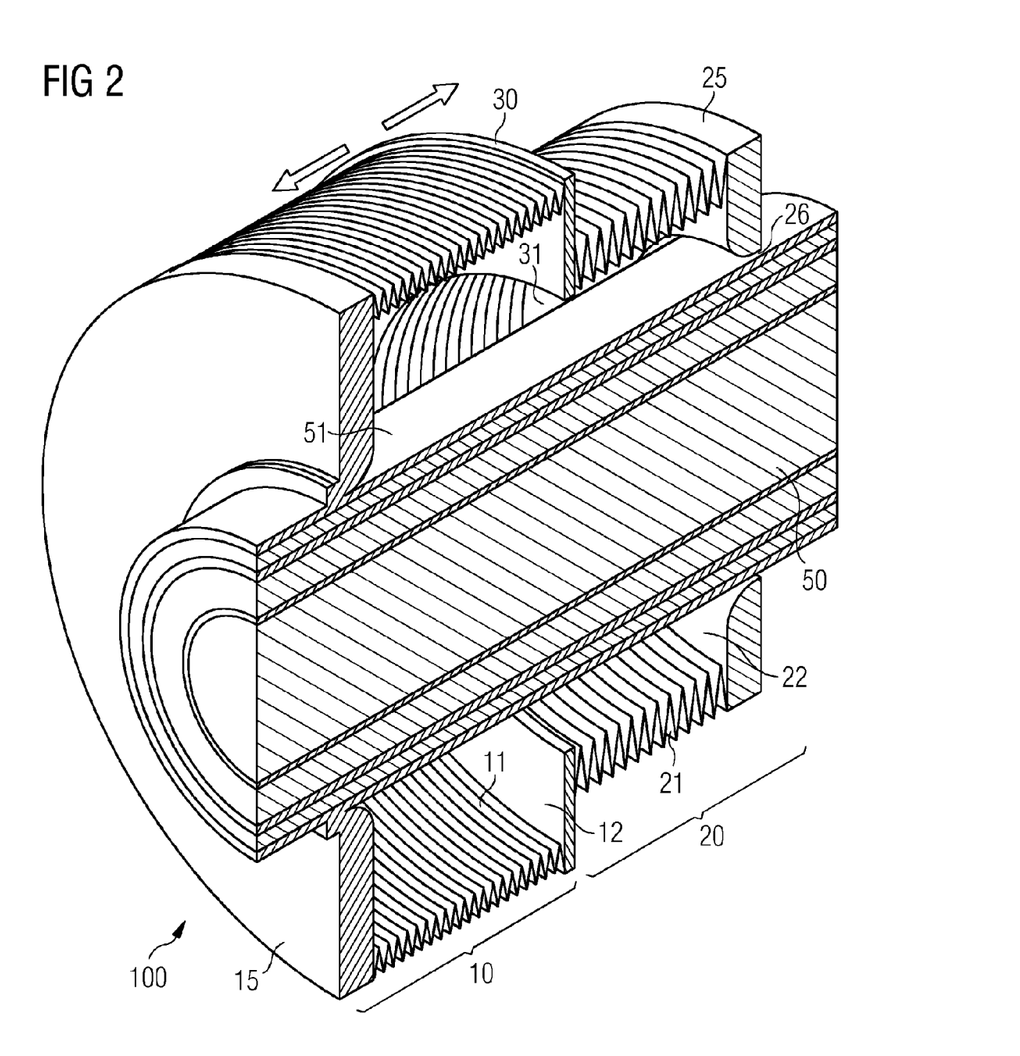
FIG. 2 is a perspective sectional side view of a pressure compensator according to an embodiment of the invention.

FIG. 2 illustrates a particular implementation of the pressure compensator 100 of FIG. 1. Accordingly, the above explanations are equally applicable. In FIG. 2, the end walls 15, 25 are annular end walls having a central opening. Furthermore, the moveable element 30 has an annular shape with a central opening.

A cylindrical structure 50 is furthermore provided. The cylindrical structure 50 may form part of the pressure compensator 100, or may form part of an electrical connection device in which the pressure compensator 100 is mounted. Cylindrical structure 50 can for example be implemented in form of a simple cylinder (e.g. a shell or sleeve), or as in the example of FIG. 2 as an insulated conductor. The end wall 15 is mounted and sealed to the cylindrical structure 50. The inner diameter of the central opening of the second end wall 25 is larger than the outer diameter of the cylindrical structure 50, so that an annular passage is provided between the cylindrical structure 50 and the end wall 25. This annular passage 26 provides a flow channel through which medium can enter and leave the first and second volumes 12, 22. End wall 25 may be mounted to or affixed to another part of the electrical connection device in which pressure compensator 100 is mounted, e.g. to a housing. In other embodiments, the flow passage 26 may be provided differently, for example by means of only open annular sections, or by through holes in wall 25.

Similarly, the moveable element 30 has a central opening with a diameter that is larger than the outer diameter of cylindrical structure 50. Accordingly, the flow passage 31 is provided by the annular flow passage formed between moveable element 30 and cylindrical structure 50 and allows the fluid to flow between the first and the second volumes 12, 22. Again, flow passage 31 may be configured differently, it may for example be provided only by open annular sections, or it may be provided by through-holes or other openings within the moveable element 30.

In such configuration, there is no sealing required between the moveable element 30 and the cylindrical structure 50. This is beneficial since providing a seal between a stationary component and a moving component is generally technically challenging, in particular when operation needs to be ensured for prolonged periods of time, such as tens of years for subsea equipment. The configuration of the pressure compensator as illustrated in FIG. 2 allows the passage of the cylindrical structure 50 through the pressure compensator without the requirement for such sealing. Accordingly, a very compact configuration of the pressure compensator 100 can be obtained while keeping the complexity relatively low and thus enabling relatively long lifetimes. Also, the pressure compensator 100 has at both ends fixed end walls, to which other components of the connector can be mounted and sealed, thus facilitating the installation of pressure compensator 100 in for example a subsea connector or a subsea termination assembly.

Figure 3A:
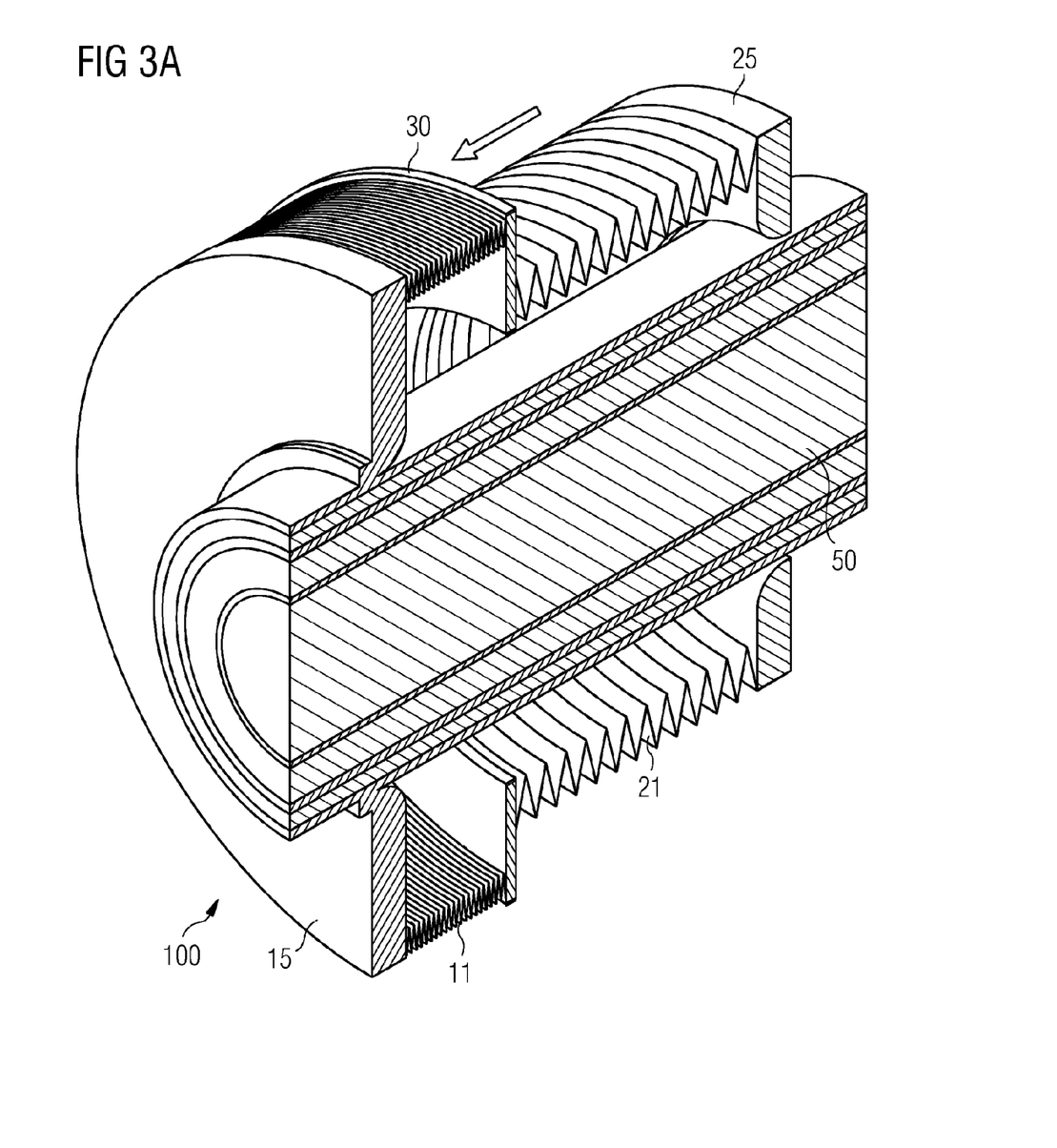
FIGS. 3A and 3B are perspective sectional side views of the pressure compensator of FIG. 2 in two different states of compensation.
Figure 3B:
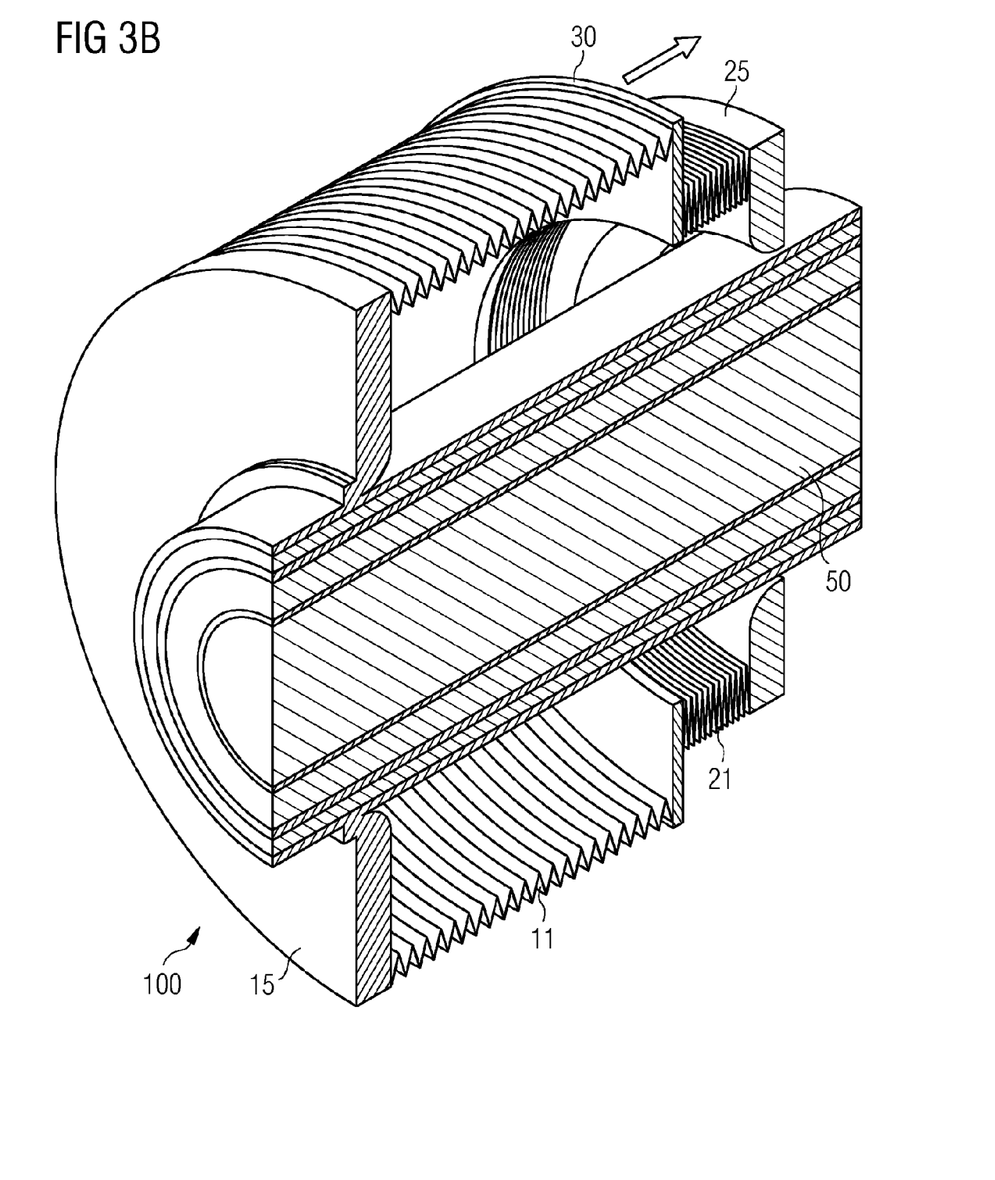

FIG. 3A shows the pressure compensator 100 of FIG. 2 with first bellows portion 11 in a compressed state in which the combined volume 12, 22 is relatively small. As can be seen, the first and larger diameter bellows portion 11 is compressed while the second and smaller diameter bellows portion 21 is expanded. The total volume enclosed by these bellows portions is accordingly lower than in the state illustrated in FIG. 2. In FIG. 3B, the pressure compensator 100 is in the expanded state in which moveable element 30 is moved towards the right, the first bellows portion 11 is expanded and the second bellows portion 21 is compressed. As can be seen, the combined volume 12, 22 enclosed by the pressure compensator 100 is larger than in the state illustrated in FIG. 2.

Figure 4:
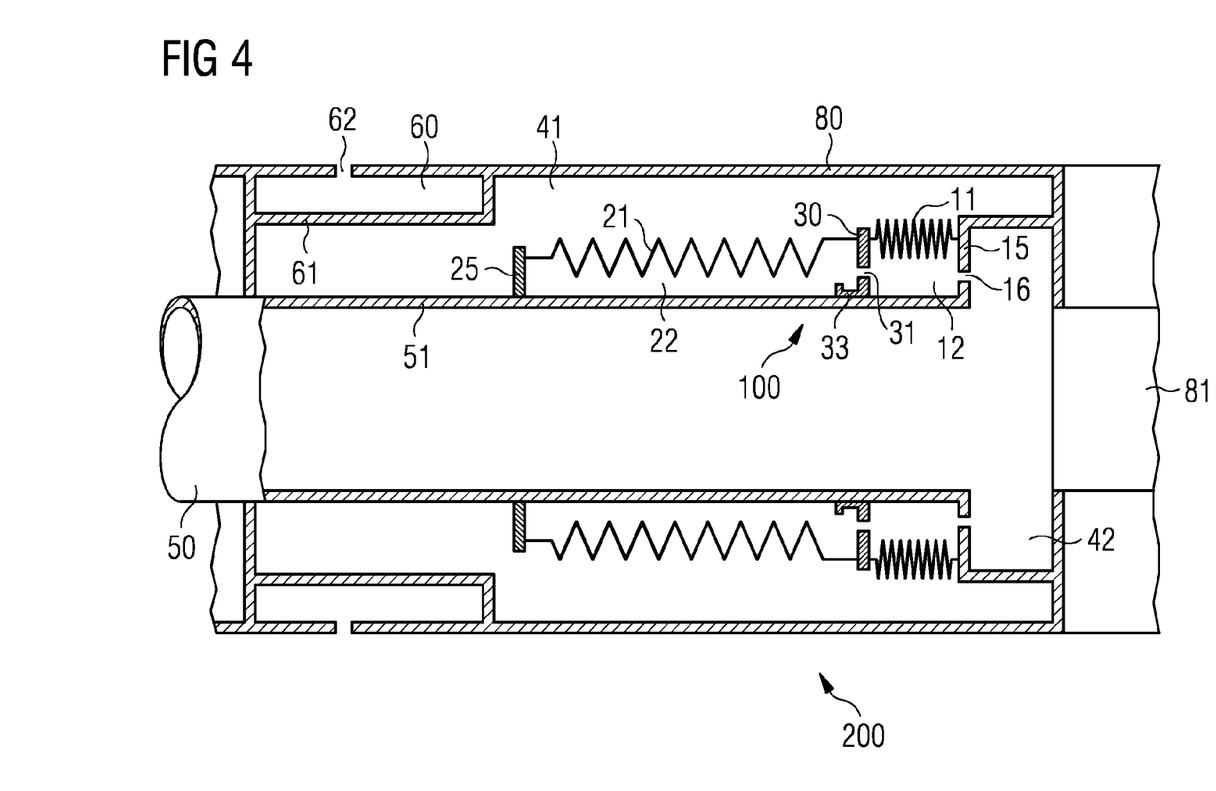
FIG. 4 is a schematic drawing showing a sectional side view of an electrical connection device including a pressure compensator according to an embodiment of the invention.

FIG. 4 shows an electrical connection device 200 comprising a pressure compensator according to an embodiment of the invention. The pressure compensator 100 can be configured as outlined above, so the above explanations are equally applicable. The electrical connection device 200 is in the example of FIG. 4 a connector part, in particular a plug part of a subsea connector. The plug part has a housing 80 and a shuttle pin 81, which is pushed inwards upon mating with a complementary connector part (receptacle part, not shown). The plug part comprises the cylindrical structure 50 with an outer surface 51. The plug part has a chamber 42 or 'secondary volume' for which the pressure compensator 100 provides pressure compensation.

The pressure compensator 100 includes the first end wall 15 which is mounted to the cylindrical structure 50 and includes the flow passage 16 towards the secondary volume 42. As mentioned further above, flow passage 16 may also be provided as an annular opening between cylindrical structure 50 and end wall 15. The second end wall 25 is mounted and sealed to the cylindrical structure 51. The first and second bellows portions 11, 21 are at one end mounted to the respective end wall 15, 25 and at the other end to the moveable element 30. In FIG. 4, a compressed state is illustrated in which the larger diameter bellows portion 11 is compressed and thus the combined volume 12, 22 is relatively small. Moveable element 30 can now travel towards the left to increase the combined volume, thereby compressing the second bellows portion 21 and expanding the first bellows portion 11.

Moveable element 30 furthermore has a bearing surface 33 that bears against the outer surface 51 of the cylindrical structure 50. Accordingly, moveable element 30 and thus the bellows portions 11, 21 are supported and protected against lateral movements. In the moveable element 30, a flow passage 31 for allowing flow communication between volumes 12, 22 is provided by means of dedicated openings, but may also be provided in any of the above outlined ways.

Pressure compensator 100 separates the chamber 42 and thus the secondary volume from the chamber 41 and thus the primary volume. The primary volume thus also changes upon movement of moveable element 30. This volume change is accommodated by the resilient element 61, which provides volume compensation and pressure balancing between the chamber and primary volume 41 and an ambient medium surrounding the electrical connection device 200. The resilient element 61 may be an elastomeric membrane. As an example, when installed subsea, seawater may enter the chamber 60 through a flow passage 62, and the resilient element 61 may provide pressure balancing between the seawater and the primary volume 41.

Bellows portions 11, 22 are made of metal. Accordingly, even if seawater penetrates through the resilient element 61 into the primary volume 41 (e.g. due to diffusion or permeation), the bellows portions 11, 21 form an impermeable barrier for the seawater, thus protecting the secondary volume 42 from seawater ingress. In other embodiments, a further pressure compensator employing metal bellows, which can be configured as described herein, or any other pressure compensator may be employed instead of the resilient element 61. In other configurations, no primary volume 41 may be provided and the bellows portions 11, 21 may be directly exposed to an ambient medium, e.g. seawater.

Each bellows portion 11, 21 may at both ends be provided with a flange by which it is bolted to the respective end wall and moveable element. Sealing may occur by means of an O-ring seal, such as an elastomeric or metal O-ring seal. In other embodiments, one or both ends of the respective bellows portion may be welded or soldered to the end wall and/or moveable element.

Figure 5A:
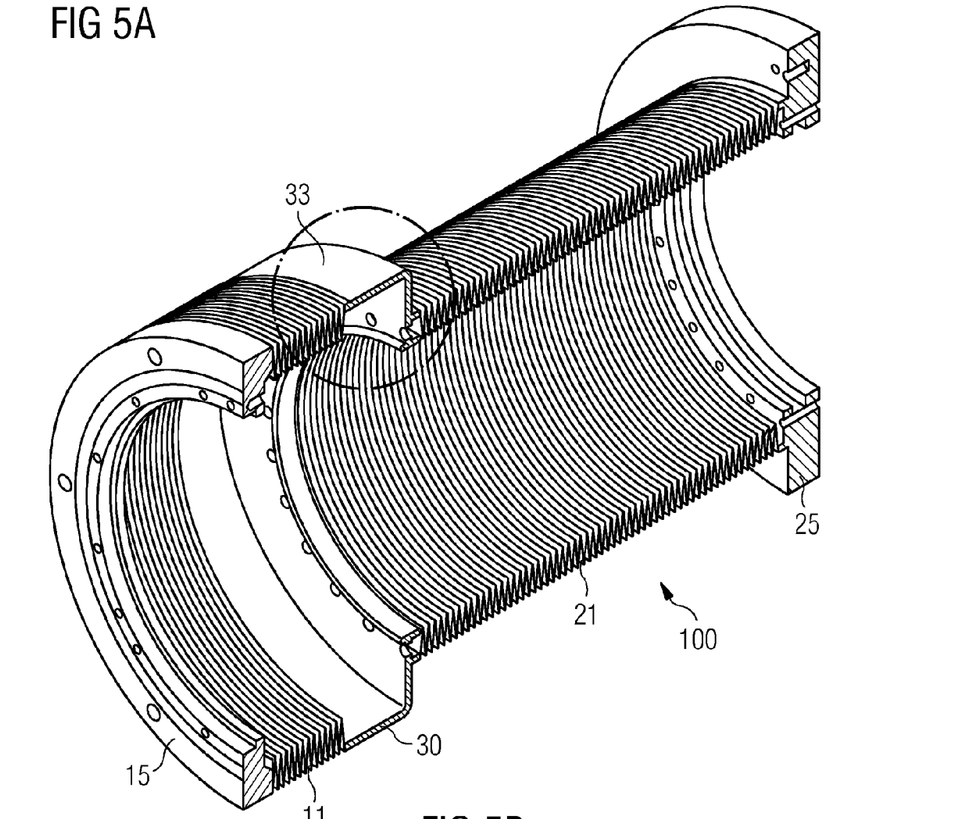
FIGS. 5A and 5B are schematic drawings showing perspective sectional views of a pressure compensator according to a further embodiment of the invention.

In FIG. 4, the moveable element 30 is by means of the bearing surface 33 supported against the inner cylindrical structure 50. In the embodiment of FIG. 5A, the bearing surface 33 is provided at an outer diameter portion of the moveable element 30 for supporting the moveable element 30 at its outer circumference against for example a housing 45 (see for example FIG. 1). Bearing surface 33 bears against the housing 45 which constitutes a guiding structure that guides the moveable element 30 along the predetermined axis 40. Due to this guidance and support, lateral movements of moveable element 30 are restricted, thus increasing the resistance of the pressure compensator 100 against vibrations and the like.

Figure 5B:
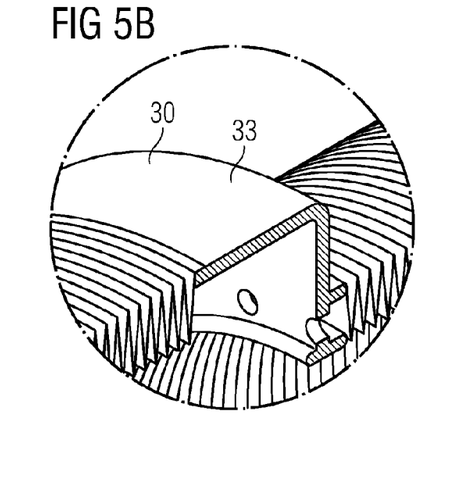

The FIG. 5B is an enlarged view of the encircled region of FIG. 5A and illustrates the moveable element 30 in more detail. Moveable element 30 is provided by a one piece coupling flange to which the first and second bellows portions 11, 21 are attached. The coupling flange is shaped so as to provide the bearing surface 33. It has a cylindrical section, the outer surface of the cylindrical section providing the bearing surface 33. The guiding structure, for example the cylindrical housing 45, which supports the coupling flange at the bearing surface 33 is not shown for clarity. The width of the bearing surface 33 in axial direction is wide enough compared to the diameter of the moveable element 30 so as to prevent cross-locking of moveable element 30 in the respective guiding structure, e.g. housing 45.

Figure 6A:
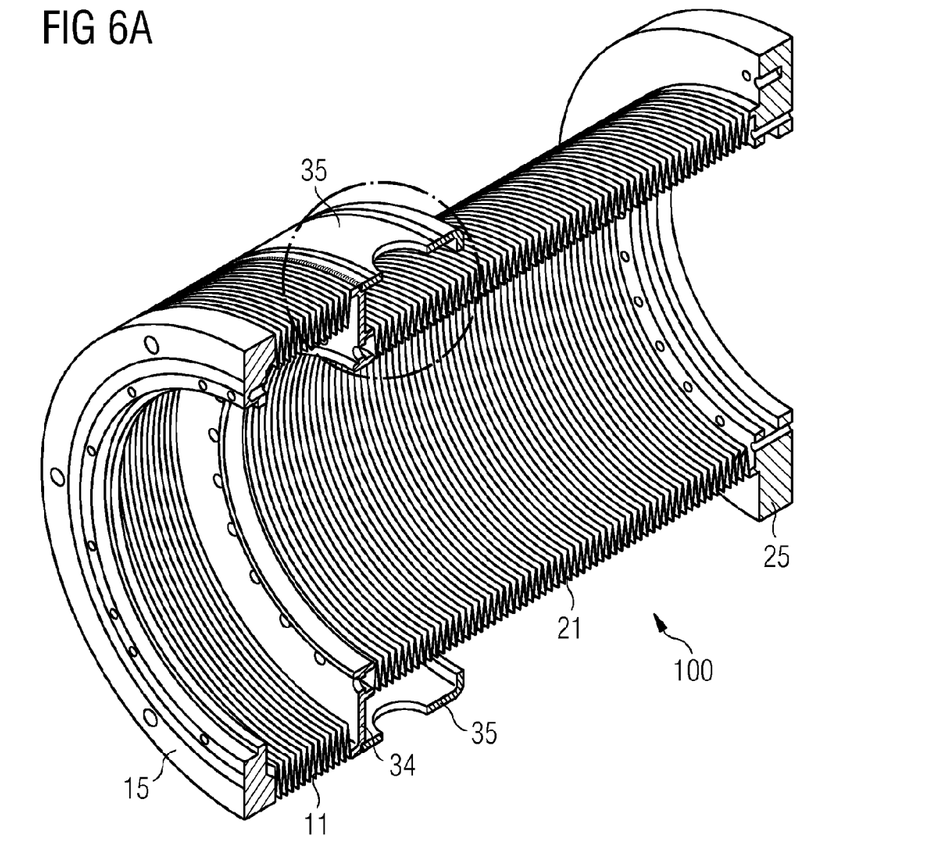
FIGS. 6A and 6B are schematic drawings showing perspective sectional views of a pressure compensator according to a further embodiment of the invention.
Figure 6B:
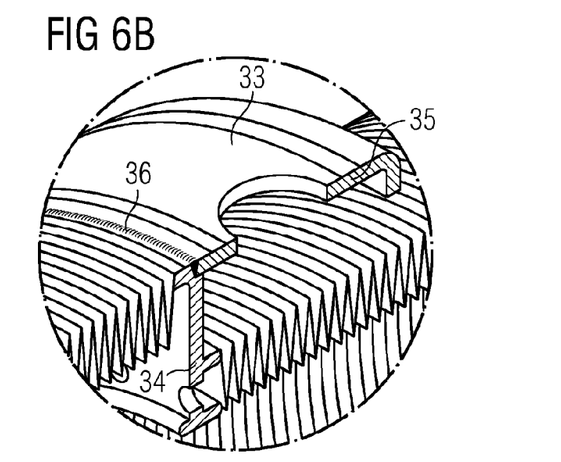

In FIG. 6A, the moveable element 30 is composed of the coupling flange 34 and the bearing ring 35. FIG. 6B is an enlarged view of the encircled region of FIG. 6A. Again, both bellows portions 11, 21 are attached to the coupling flange 34. The bearing ring 35 (having the shape of a cylindrical section) is mounted to the coupling flange 34. Bearing ring 35 overlaps the second bellows portion 21. This allows a compact configuration, since the bearing surface 33, which is provided on the outer circumference of the bearing ring 35, does not contribute to the axial extension of pressure compensator 100. Furthermore, the width of bearing ring 35 can be further extended to improve protection against cross-locking inside the cylindrical housing 45, without affecting the total axial extension of compensator 100. The bearing ring 35 can be configured to have a width that allows the bearing ring 35 to act as a travel stop by abutting the end wall 25. Over-compression of the second bellows portion 21 is thus avoided. The bearing ring 35 may be attached to the coupling flange 34 by means of a welded joint 36, or it may be bolted thereto or the like.

Figure 7A:
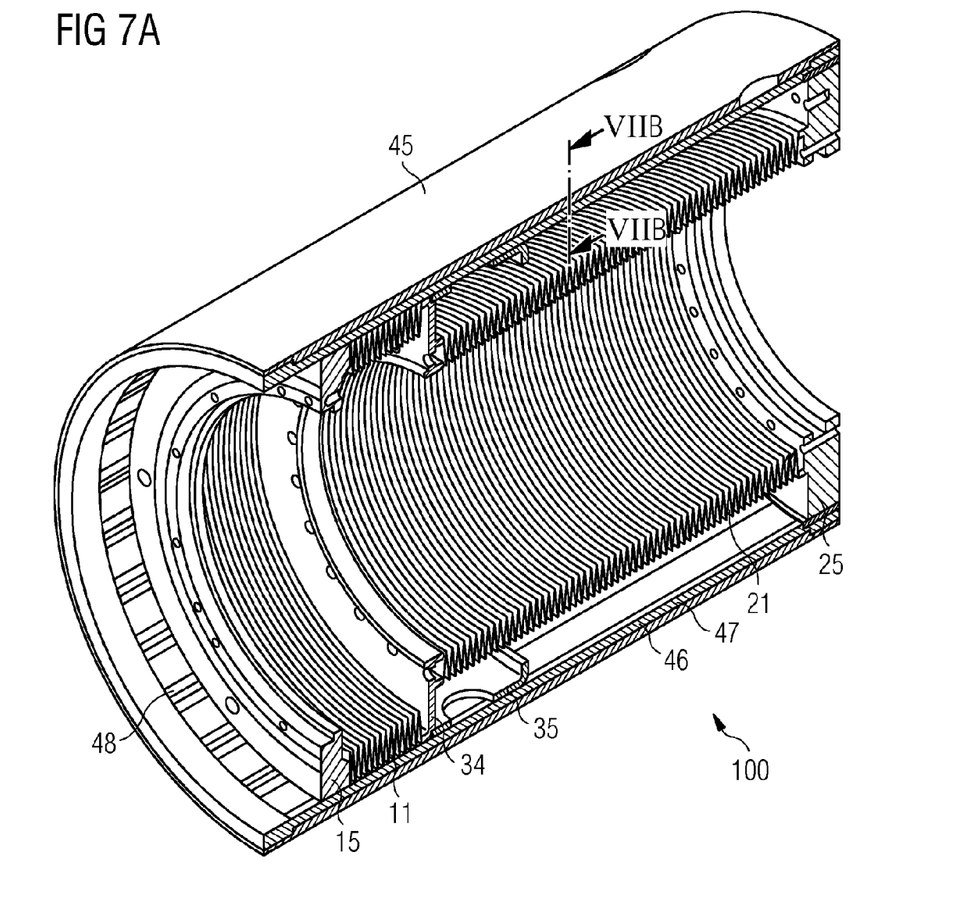
FIGS. 7A and 7B are schematic drawings showing sectional views of a pressure compensator according to a further embodiment of the invention.

FIG. 7A illustrates a further embodiment of the pressure compensator 100 which may be employed with any previously described guiding structures and bearing surfaces. In the example of FIG. 7A, the guiding structure is again provided by a housing 45. The housing 45 has a rigid structure 46 and a structure 47 made of a compliant material. The bearing surface 33 bears against the compliant material. Accordingly, high accelerations of the moveable element 30 can be damped efficiently, and local accelerations due to collisions between the guiding structure and the bearing surface of the moveable element, which may occur during vibration, may be avoided.

Figure 7B:
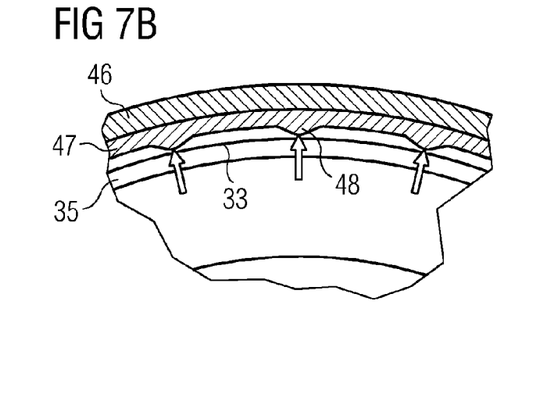

The FIG. 7B shows the enlargement of a cross section taken in the plane that is indicated in FIG. 7A. As can be seen, the structure 47 of compliant material may be provided with ridges 48, which protrude from the surface. These ridges may for example be aligned substantially parallel to the axial direction. The ridges may provide progressive cushioning for the bearing surface 33. These splines or ridges of compliant material may also be directly applied to the rigid structure 46. The ridges or splines 48 also provide protection of moveable element 40 against vibration by progressively arresting displacement.

Furthermore, damping against vibration may additionally or alternatively be provided by filling the volume inside and/or outside the bellows portions with a viscous medium, such as oil or gel. This way, support may by provided and high accelerations may be damped.

Although FIGS. 5, 6 and 7 illustrate embodiments in which the bearing surface 33 is an outer surface which bears against an inner surface of a guiding structure, it should be clear that the features of these embodiments are equally applicable to other configurations, for example a configuration in which the bearing surface 33 is an inner surface which bears against an outer surface of a guiding structure, such as the outer surface 51 of the cylindrical structure 50 illustrated in FIG. 4.

Figure 8:
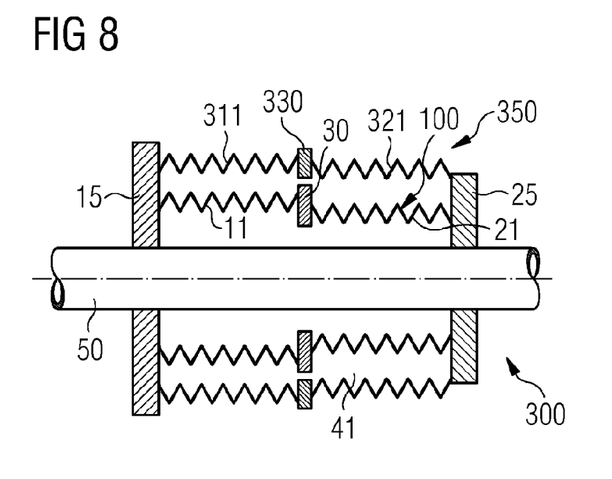
FIG. 8 is a sectional side view of a pressure compensation assembly comprising a pressure compensator according to a further embodiment of the invention.

FIG. 8 illustrates a pressure compensation assembly 300 which includes a pressure compensator 100 having any of the above described configurations. In particular, the pressure compensator 100 includes the first and second end walls 15, 25, the first and second bellows portions 11, 21 and the moveable element 30. Around this first pressure compensator, a second pressure compensator 350 is provided, which includes the first and second bellows portions 311, 321 and the moveable element 330. The second pressure compensator may employ the same end walls 15, 25, yet may in other embodiments employ separate end walls. Accordingly, in such configuration, a double barrier against the ingress of seawater can be achieved. As an example, the inner moveable element 30 may be supported by the cylindrical structure 50, while the outer moveable element 330 may be supported against a cylindrical housing (not shown). The first pressure compensator may for example provide pressure compensation for a secondary volume, while the second pressure compensator may provide pressure compensation for a primary volume, as explained with respect to FIGS. 1 and 4. In the example, the second pressure compensator 350 essentially forms a chamber around the first pressure compensator 100. Flow passages towards the chambers which are pressure compensated are not shown in FIG. 8.

Figure 9:
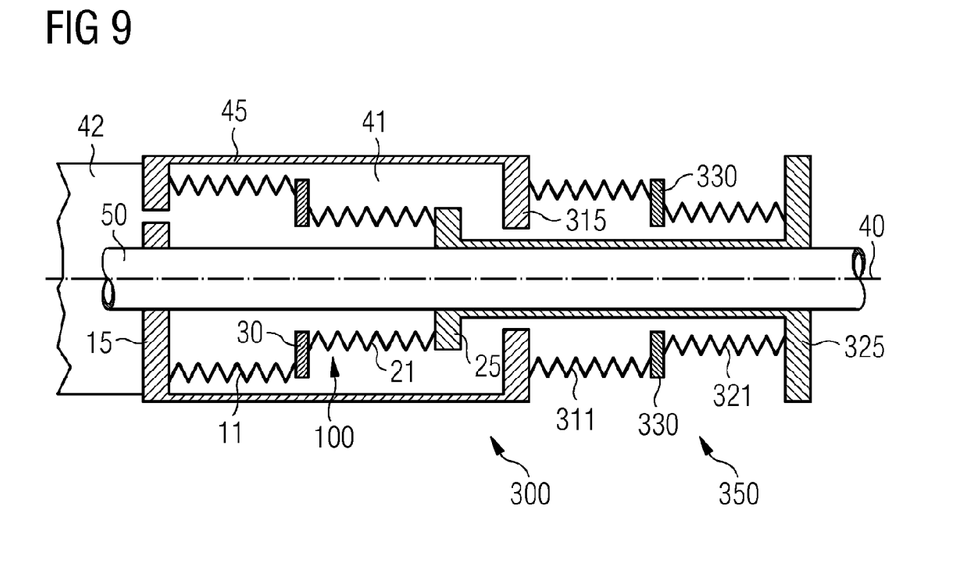
FIG. 9 is a sectional side view of a pressure compensation assembly comprising a pressure compensator according to an embodiment of the invention.

FIG. 9 illustrates a further embodiment of the pressure compensation assembly 300. The chamber 42 or secondary volume is pressure compensated by a first pressure compensator 100 comprising the end walls 15, 25, the bellows portions 11, 21 and the moveable element 30. The first pressure compensator is arranged in the chamber 41 or primary volume. Moveable element 30 may be supported and guided by the housing 45 and/or the cylindrical structure 50.

A second pressure compensator 350 comprising the end of walls 315, 325, the bellows portions 311, 321 and the moveable element 330 is further provided. The second pressure compensator 350 is in flow communication with the chamber 41 or primary volume. As can be seen, the first and second pressure compensators are arranged along the axis 40 such that the bellows portions 11, 21 and 311, 321 of the first and second compensators do not overlap in radial direction. Accordingly, a compact arrangement that has relatively low radial extension can be achieved. Outside the second pressure compensator, a medium such as seawater may for example be present.

Any of the pressures compensators illustrated in FIGS. 8 and 9 can be configured in accordance with any of the embodiments and configurations outlined further above.

Both pressure compensation assemblies 300 of FIGS. 8 and 9 achieve a double barrier against the ingress of seawater by using metal bellows, which may improve the reliability and lifetime of an electric connection device in which these configurations are employed.

While specific embodiments are disclosed herein, various changes and modifications can be made without departing from the scope of the invention. The present embodiments are to be considered in all respects as illustrative and non restrictive, and all changes coming within the meaning and equivalency range of the appended claims are intended to be embraced therein.

The invention claimed is:

1. A pressure compensator for compensating volume variations of a medium, comprising:
    a first compensator part and a second compensator part, wherein the first compensator part encloses a first volume and the second compensator part encloses a second volume, wherein the first and the second volumes are in flow communication, wherein the first compensator part includes a first bellows portion and the second compensator part includes a second bellows portion,
    a movable element to which the first bellows portion and the second bellows portion are mechanically coupled such that movement of the movable element in a predetermined direction results in the compression of one of said bellows portions and in the expansion of the other of the bellows portions,
    wherein the first and second compensator parts are configured such that a movement of the movable element in the predetermined direction results in a volume change of the first volume and in a volume change of the second volume that is different to the volume change of the first volume.

2. The pressure compensator according to claim 1, wherein the first bellows portion has a circumference that is larger than a circumference of the second bellows portion, the volume change of the first volume being larger than the volume change of the second volume when moving said movable element.

3. The pressure compensator according to claim 1, wherein the first compensator part has a first end wall and the second compensator part has a second end wall, wherein the first and second end walls have a fixed distance, the movable element being movable with respect to the first and second end walls.

4. The pressure compensator according to claim 1, wherein the movable element has an annular shape, wherein an opening in the movable element provides said flow communication between the first and second volumes.

5. The pressure compensator according to claim 1, wherein said movable element has a central opening and is configured to allow the arrangement of a cylindrical structure through the central opening such that the flow communication between the first and second volumes occurs through an opening formed between the cylindrical structure and the movable element.

6. The pressure compensator according to claim 1, further comprising
a guiding structure, wherein the movable element has a bearing surface that bears against the guiding structure to guide the movable element in the predetermined direction during movement thereof.

7. The pressure compensator according to claim 6, wherein the movable element comprises a bearing ring that provides the bearing surface, the bearing ring being shaped so as to at least partially overlap the first or second bellows portion.

8. The pressure compensator according to claim 6, wherein the guiding structure comprises a compensator housing, the first compensator part and the second compensator part being at least partially arranged in the compensator housing, the bearing surface comprising an outer peripheral surface of the movable element that bears against an inner surface of the compensator housing.

9. The pressure compensator according to claim 6, wherein the guiding structure comprises a structure arranged inside the first and/or second compensator part, the bearing surface comprising an inner surface of the movable element that bears against an outer surface of the structure.

10. The pressure compensator according to claim 1, wherein the first compensator part has a first annular end wall and the second compensator part has a second annular end wall, and wherein the movable element has an annular shape and is arranged between the first and second annular end walls and movable relatively thereto, the first and second annular end walls and the movable element being arranged coaxially to one another, wherein the first and second end walls and the movable element are configured to be arranged on a cylindrical structure or to allow the passing of a cylindrical structure therethrough.

11. The pressure compensator according to claim 1, wherein the first and second bellows portions are cylindrical bellows portions each being mounted at one end to the movable element and at the other end to an end wall of the respective first or second compensator part, the first bellows portion having a larger diameter than the second bellows portion, the first and second bellows portions and the movable element being arranged between the end walls.

12. An electrical connection device for use underwater or in a wet or severe environment, comprising:
a housing,
a chamber in the housing filled with dielectric medium,
a cylindrical structure or a cylindrical passage arranged in the housing, and
a pressure compensator according to claim 1,
wherein the pressure compensator is arranged in the housing around the cylindrical structure or cylindrical passage, the first and second volumes of the pressure compensator being in flow communication with said chamber to provide pressure compensation for said chamber.

13. The electrical connection device according to claim 12, wherein the electrical connection device is a connector part, a cable termination assembly, a cable gland, or an interface unit for a connector.

14. The electrical connection device according to claim 12, wherein the pressure compensator is arranged in the housing to provide pressure compensation for a first chamber, the pressure compensator further providing a liquid tight barrier between the first chamber and a second chamber, the electrical connection device further comprising at least one further pressure compensator configured to provide pressure balancing between the second chamber and an ambient medium surrounding the electrical connection device when installed subsea.

15. A pressure compensation assembly comprising:
a first pressure compensator and a second pressure compensator, both first and second pressure compensators according to claim 1, and
a first chamber,
wherein the first pressure compensator is in flow communication with the first chamber to provide pressure compensation, wherein the first pressure compensator is arranged in a second chamber, and
wherein the second pressure compensator is flow communication with the second chamber to provide pressure compensation thereof.

16. A method of manufacturing a pressure compensator, comprising:
providing a first compensator part including a first bellows portion, the first compensator part enclosing a first volume;
providing a second compensator part including a second bellows portion, the second compensator part enclosing a second volume;
providing a movable element, wherein the first volume and the second volume are in flow communication through or around the movable element; and
mechanically coupling the first bellows portion and the second bellows portion to the movable element such that movement of the movable element in a predetermined direction results in the compression of one of said bellows portions and in the expansion of the other of the bellows portions,
wherein the first and second compensator parts are configured such that a movement of the movable element in the predetermined direction results in a volume change of the first volume and in a volume change of the second volume that is different to the volume change of the first volume.

* * * * *